United States Patent
Lee

(10) Patent No.: US 7,417,512 B2
(45) Date of Patent: Aug. 26, 2008

(54) DUAL MODE TUNING DIGITALLY CONTROLLED CRYSTAL OSCILLATOR AND OPERATION METHOD THEREOF

(75) Inventor: Kun-Seok Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 106 days.

(21) Appl. No.: 11/360,320

(22) Filed: Feb. 23, 2006

(65) Prior Publication Data

US 2006/0197620 A1  Sep. 7, 2006

(30) Foreign Application Priority Data

Mar. 7, 2005 (KR) ........................ 10-2005-0018704

(51) Int. Cl.
*H03B 5/32* (2006.01)
(52) U.S. Cl. ............... 331/158; 331/116 R; 331/177 R; 331/177 V
(58) Field of Classification Search ............. 331/116 R, 331/116 FE, 117 R, 117 FE, 154, 158, 167, 331/175, 177 R, 177 V
See application file for complete search history.

(56) References Cited

U.S. PATENT DOCUMENTS

| | | | |
|---|---|---|---|
| 4,153,884 A * | 5/1979 | Ikeguchi et al. | ............. 331/1 A |
| 4,568,888 A | 2/1986 | Kimura et al. | |
| 6,556,093 B2 * | 4/2003 | Craninckx et al. | ...... 331/117 R |
| 6,597,249 B2 | 7/2003 | Chien et al. | |
| 6,642,799 B2 | 11/2003 | Tang | |
| 6,747,522 B2 | 6/2004 | Pietruszynski et al. | |
| 6,927,637 B1 * | 8/2005 | Koh et al. | ............... 331/117 R |
| 7,170,332 B2 * | 1/2007 | Goldfarb et al. | ............ 327/291 |
| 2004/0082982 A1 | 4/2004 | Gord et al. | |
| 2004/0201428 A1 | 10/2004 | Kenney et al. | |

FOREIGN PATENT DOCUMENTS

| | | |
|---|---|---|
| EP | 0 203 756 A2 | 12/1986 |
| EP | 1 193 875 A1 | 4/2002 |
| KR | 2005 0017193 | 2/2005 |

* cited by examiner

*Primary Examiner*—Robert J. Pascal
*Assistant Examiner*—Ryan J Johnson
(74) *Attorney, Agent, or Firm*—F. Chau & Associates, LLC

(57) ABSTRACT

A dual mode tuning digitally controlled crystal oscillator includes a crystal resonator, an oscillation circuit, a coarse mode tuning unit and a fine mode tuning unit. The crystal resonator resonates at substantially a predetermined resonance frequency. The oscillation circuit generates an oscillation frequency based on the resonance frequency to output the oscillation frequency. The coarse mode tuning unit performs a coarse mode tuning operation on the oscillation frequency in response to a coarse mode tuning signal, and the fine mode tuning unit performs a fine mode tuning operation on the oscillation frequency in response to a fine mode tuning signal, to substantially compensate for a frequency error of the crystal resonator. The coarse mode tuning control unit controls the coarse mode tuning signal to output a controlled coarse mode tuning signal to the coarse mode tuning unit, in response to the fine mode tuning signal.

19 Claims, 6 Drawing Sheets

DUAL MODE TUNING DIGITALLY CONTROLLED CRYSTAL OSCILLATOR AND OPERATION METHOD THEREOF

CROSS-REFERENCE TO RELATED APPLICATIONS

This application claims priority to Korean Patent Application No. 2005-18704 filed on Mar. 7, 2005 in the Korean Intellectual Property Office (KIPO), the entire contents of which are hereby incorporated by reference.

BACKGROUND OF THE INVENTION

1. Field of the Invention

The present invention relates to a reference frequency generator, and more specifically to a digitally controlled crystal oscillator and a dual mode tuning method thereof.

2. Description of Related Art

In a radio communication system, a frequency synthesizer generates a channel frequency used by a receiver and a transmitter. The frequency synthesizer includes a Phase-Locked Loop (PLL) and generates a desired channel frequency using a predetermined reference frequency.

A reference frequency oscillator generates the reference frequency having an accuracy needed to stably synthesize the channel frequency and for a stable radio communication. The reference frequency oscillator includes a crystal resonator having a high Q value. The crystal resonator may have a frequency error due to various factors such as temperature variation, initial crystal offset, aging and the like.

A Voltage-Controlled Temperature Compensated Crystal Oscillator (hereinafter referred to as "VC-TCXO") directly and indirectly compensates for the frequency error of the crystal resonator.

The VC-TCXO includes a voltage control oscillator for oscillating at a resonance frequency of the crystal resonator. The VC-TCXO controls the voltage control oscillator using an analog circuit configuration, and indirectly compensates for the frequency error of a crystal resonator. For example, the VC-TCXO uses a temperature compensation circuit having a thermistor, and controls a varactor diode capacitance of an LC voltage control oscillator so as to compensate for a frequency variation of the crystal resonator.

The VC-TCXO needs to be implemented as a different chip, separated from a transceiver chip. Such an implementation adds to the manufacturing costs and the area needed for mounting.

A Digitally Controlled Crystal Oscillator (hereinafter referred to as "DCXO") has been used in products instead of the VC-TCXO.

The DCXO is the reference frequency oscillator that compensates for the frequency error of the crystal resonator and generates the reference frequency using both an analog circuit and a digital circuit.

The DCXO includes the circuits of the VC-TCXO except for the crystal resonator. The DCXO and the transceiver chip can be implemented as one chip. In comparison with the VC-TCXO, the DCXO is suitable for a wireless mobile communication terminal having size and weight limitations. The integrated chip has a reduced mounting area and may be manufactured at a reduced cost.

The DCXO can use a dual mode tuning technique so as to expand a tuning range and increase tuning speed. The dual mode tuning technique includes of both coarse mode tuning and fine mode tuning.

The coarse mode tuning is a process for compensating for a change of an offset frequency in each crystal resonator and a change of a load capacitance depending upon a manufacturing process change. The coarse mode tuning is performed by selecting a coarse mode signal composed of a digital control code inputted through a digital interface from an external source. The digital control code may be determined through calibration of a manufacturing process and stored in a table, or the like.

The fine mode tuning is a process for tuning a frequency more finely after the coarse mode tuning is completed. The fine mode tuning is also a process of compensating for the frequency error due to aging or temperature variation of the crystal resonator, thereby being minutely performed on a scale of sub-parts per million (ppm). The digitally controlled crystal oscillator for the fine mode tuning receives an Automatic Frequency Control (AFC) signal from the external source, for example, a modem chip.

FIG. 1 is a block diagram of a dual mode digitally controlled crystal oscillator.

Referring to FIG. 1, the dual mode tuning digitally controlled crystal oscillator 100 includes an off-chip crystal resonator 101, an on-chip oscillation circuit 111, a coarse mode tuning unit 112, and a fine mode tuning unit 113.

The oscillation circuit 111 uses an LC oscillator that generates an oscillation frequency using LC resonance.

The coarse mode tuning unit 112 performs a coarse mode tuning for the oscillation circuit 111. The coarse mode tuning unit 112 receives a coarse mode tuning signal (CO_TUNE) from the external source and controls capacitance of an oscillator tank by controlling a capacitor bank included in the oscillator 111 in response to the received tuning signal (CO_TUNE).

The fine mode tuning unit 113 performs a fine mode tuning for the oscillation circuit 111. The fine mode tuning unit 113 receives a fine mode tuning signal (FI_TUNE) from the external source, and oscillates a reference frequency (FREF) by controlling the oscillation circuit 111 in response to the received tuning signal (FI_TUNE). The fine mode tuning signal (FI_TUNE) may be an AFC signal received from the modem chip.

The coarse mode tuning signal (CO_TUNE) and the fine mode tuning signal (FI_TUNE) may be composed of a digital or an analog control signal. In case that the coarse mode tuning signal (CO_TUNE) and the fine mode tuning signal (FI_TUNE) are composed of a digital control code, the coarse mode tuning unit 112 and the fine mode tuning unit 113 may operate by receiving the digital control code and by controlling the capacitor bank included in the oscillation circuit 111. Alternatively, in case that the coarse mode tuning signal (CO_TUNE) and the fine mode tuning signal (FI_TUNE) are composed of an analog control signal, the coarse mode tuning unit 112 and the fine mode tuning unit 113 may operate, for example, by receiving a control voltage and by changing the capacitance of the varactor diode.

The coarse mode tuning and the fine mode tuning respectively have a tuning range and a tuning resolution. It is desirable for a fine mode tuning range to cover only a minimum unit interval of the coarse mode tuning range. In an actual implementation, the fine mode tuning range is typically designed to cover a range about 20 times as large as the minimum unit interval of the coarse mode tuning range, because the fine mode tuning has to compensate for a frequency change due to aging or temperature variation of the crystal resonator. The fine mode tuning simultaneously performs the frequency tuning because the coarse mode tuning signal is maintained without change after performing the coarse mode tuning. Additionally, since the coarse mode tuning signal for the coarse mode tuning has the same value for all samples during a calibration operation, the fine mode tuning should compensate for a difference of the crystal resonator between samples and a change of the load capacitance. Accordingly, a fine mode tuning range needs to be greater than the minimum unit interval of the course mode tuning range.

Likewise, the increased width of the fine mode tuning range increases the size of the varactor diode needed for the fine mode tuning of an analog manner and the capacitor bank needed for the fine mode tuning of a digital manner. Accordingly, the load capacitance increases, and costs in design and difficulties of a manufacturing process simultaneously increase.

Therefore, a need exists for a digitally controlled crystal oscillator and a dual mode tuning method thereof.

SUMMARY OF THE INVENTION

According to an embodiment of the present invention, a dual mode tuning digitally controlled crystal oscillator includes a crystal resonator that resonates at substantially a predetermined resonance frequency, an oscillation circuit, coupled to the crystal resonator, generating an oscillation frequency based on the resonance frequency to output the oscillation frequency, a coarse mode tuning unit performing a coarse mode tuning operation on the oscillation frequency by controlling the oscillation circuit in response to one of a coarse mode tuning signal and a controlled coarse mode tuning signal, a fine mode tuning unit performing a fine mode tuning operation on the oscillation frequency by controlling the oscillation circuit in response to a fine mode tuning signal, and a coarse mode tuning control unit controlling the coarse mode tuning signal to output the controlled coarse mode tuning signal to the coarse mode tuning unit, in response to the fine mode tuning signal.

The tuning control unit may adjust the coarse mode tuning signal downward to output an internal coarse mode tuning signal to the coarse mode tuning unit where the fine mode tuning signal approaches a lower limit of the fine mode tuning signal. The tuning control unit may adjust the current coarse mode tuning signal upward to output the internal coarse mode tuning signal to the coarse mode tuning unit where the fine mode tuning signal approaches an upper limit of the fine mode tuning signal.

The tuning control unit may include a signal comparison unit determining whether the fine mode tuning signal approaches the upper or the lower limit of the fine mode tuning signal, and a coarse mode tuning control unit controlling the coarse mode tuning signal based on a determination of the signal comparison unit to output the internal coarse mode signal to the coarse mode tuning unit.

The tuning control unit may further include a time delay control unit configured to delay an output of the internal coarse mode tuning signal by a predetermined time from a time point of the determination of the signal comparison unit.

The oscillation circuit may include a coarse mode variable capacitor unit controlling the oscillation frequency of the oscillation circuit under the control of the coarse mode tuning unit.

The coarse mode variable capacitor unit may include a capacitor bank having a plurality of capacitors and switching elements coupled in series and in parallel. In this case, the coarse mode tuning signal may include a digital control code, and the coarse mode tuning unit may change a total capacitance of the capacitor bank in response to the coarse mode tuning signal.

The coarse mode variable capacitor unit may be composed of at least one varactor diode. In this case, the coarse mode tuning signal may include an analog control signal, and the coarse mode tuning unit may change a capacitance of the varactor diode in response to the coarse mode tuning signal.

The oscillation circuit may include a fine mode variable capacitor unit controlling the oscillation frequency of the oscillation circuit under the control of the fine mode tuning unit.

The fine mode variable capacitor unit may include a capacitor bank having a plurality of capacitors and switching elements coupled in series and in parallel. In this case, the fine mode tuning signal may include a digital control code, and the fine mode tuning unit may change a total capacitance of the capacitor bank in response to the fine mode tuning signal.

Further, the fine mode variable capacitor unit may be composed of at least one varactor diode. In this case, the fine mode tuning signal includes an analog control signal, and the fine mode tuning unit may change a capacitance of the varactor diode in response to the fine mode tuning signal.

The dual mode tuning digitally controlled crystal oscillator is coupled to a phase-locked loop generating a desired channel frequency based on the oscillation frequency, wherein the dual mode tuning digitally controlled crystal oscillator and the phase-locked loop form a frequency synthesizer.

A frequency error of the crystal resonator is substantially compensated for.

According to an embodiment of the present invention, a method of operating a dual mode tuning digitally controlled crystal oscillator includes resonating a crystal resonator at substantially a predetermined resonance frequency, generating an oscillation frequency based on the resonance frequency by an oscillation circuit to output the oscillation frequency as a reference frequency, performing a coarse mode tuning operation on the oscillation frequency by controlling the oscillation circuit in response to a coarse mode tuning signal, performing a fine mode tuning operation on the oscillation frequency by controlling the oscillation circuit in response to a fine mode tuning signal, and changing the coarse mode tuning signal in response to the fine mode tuning signal to output a controlled coarse mode tuning signal.

The coarse mode tuning signal may be adjusted downwardly where the fine mode tuning signal approaches a lower limit of the fine mode tuning signal, and the coarse mode tuning signal may be adjusted upwardly where the fine mode tuning signal approaches an upper limit of the coarse mode tuning signal.

BRIEF DESCRIPTION OF THE DRAWINGS

The present invention will become more apparent by describing in detail exemplary embodiments with reference to the accompanying drawings, in which.

DETAILED DESCRIPTION OF PREFERRED EMBODIMENTS

Exemplary embodiments of the present invention are disclosed herein. Specific structural and functional details disclosed herein are merely representative for purposes of describing exemplary embodiments of the present invention; the present invention may be embodied in many alternate forms and should not be construed as limited to exemplary embodiments set forth herein.

Figure 2:
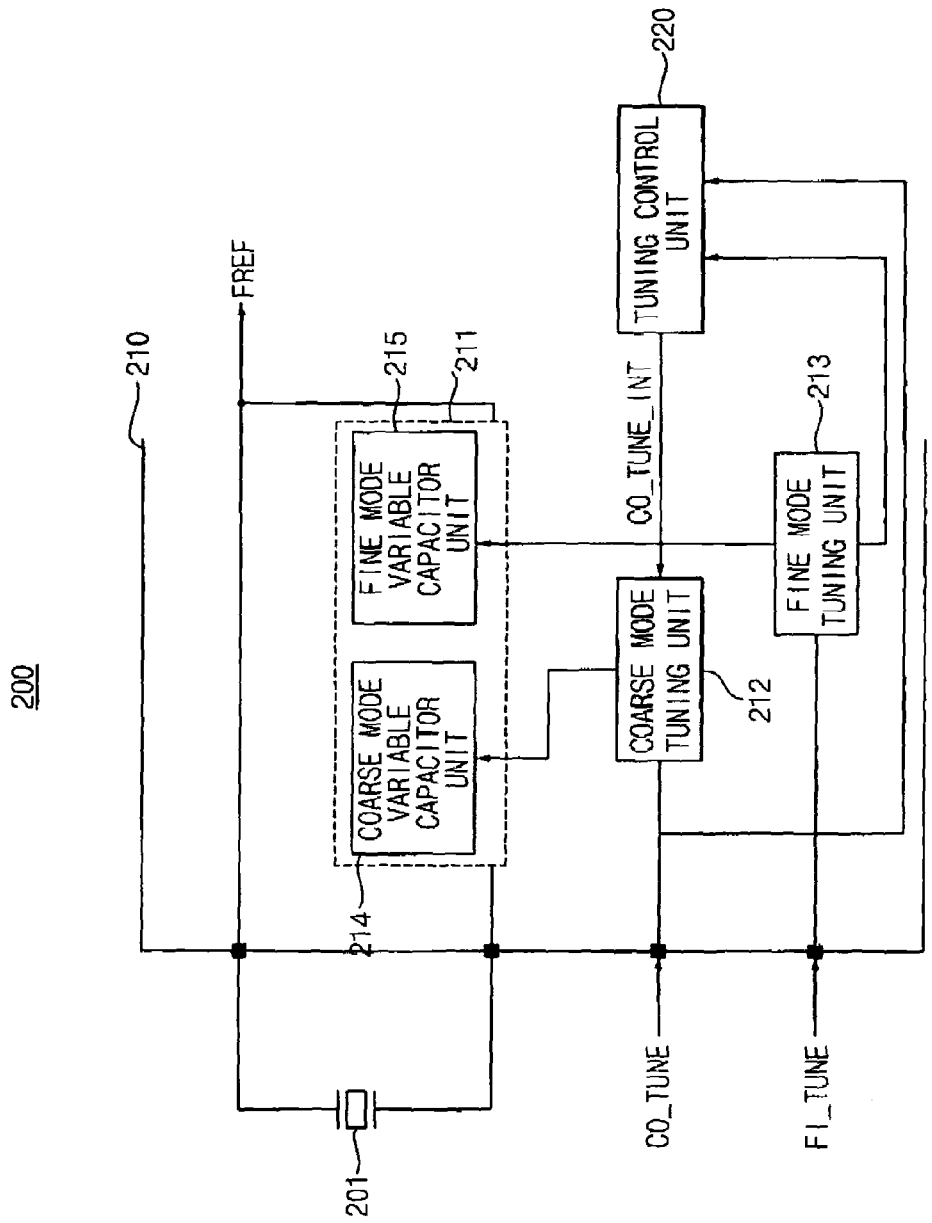
FIG. 2 is a block diagram illustrating a dual mode tuning digitally controlled crystal oscillator according to an exemplary embodiment of the present invention.

Hereinafter, preferred embodiments of the present invention will be described in detail with reference to the accompanying drawings. FIG. 2 is a block diagram illustrating a dual mode tuning digitally controlled crystal oscillator according to an exemplary embodiment of the present invention.

With reference to FIG. 2, a dual mode tuning digitally controlled crystal oscillator 200 includes an off-chip crystal resonator 201, an on-chip oscillation circuit 211, a coarse mode tuning unit 212, a fine mode tuning unit 213 and a tuning control unit 220.

The crystal resonator 201 may be implemented as an AT cut crystal resonator.

The oscillation circuit 211 coupled to the crystal resonator 201 functions as an LC oscillator (e.g., a Pierce oscillator) that generates an oscillation frequency using LC resonance. The oscillation circuit 211 includes an oscillation tank including a coarse mode variable capacitor unit 214 in which capacitance is controlled by the coarse mode tuning unit 212, and a fine mode variable capacitor unit 215 in which capacitance is controlled by the fine mode tuning unit 213.

The coarse mode tuning unit 212 performs coarse mode tuning for the dual mode digitally controlled crystal oscillator 200.

The coarse mode tuning unit 212 receives a coarse mode tuning signal (CO_TUNE) composed of a digital or analog control code from an external source and controls the coarse mode variable capacitor unit 214, which constitutes part of the oscillation circuit 211, in response to the received tuning signal.

In case that the coarse mode tuning signal (CO_TUNE) is composed of a digital control code, the coarse mode tuning is performed by selecting a digital control code received through a System Peripheral Interface (SPI), or a digital interface such as 12C or the like, from an external source. The digital control code may be determined through a calibration operation in a manufacturing process and may be stored in a table.

The coarse mode variable capacitor unit 214 may be composed of a capacitor bank including a plurality of capacitors and switching elements connected in series and parallel. The coarse mode variable capacitor unit 214 may be constructed using a varactor diode having characteristics of a variable capacitor. It will be apparent to one of ordinary skill in the art that elements having the characteristics of the variable capacitor may be used instead of the varactor diode.

In case that the coarse mode variable capacitor unit 214 is composed of the capacitor bank, the coarse mode tuning unit 212 controls the total capacitance of the capacitor bank by controlling the switching elements in response to the coarse mode tuning signal (CO_TUNE), i.e., the digital control code inputted from an external source.

The capacitor bank may have a binary weighted configuration, or alternatively a parallel array of unit capacitors respectively having the same capacitance.

In case that the coarse mode variable capacitor unit 214 is constructed using a variable capacitor element, e.g., the varactor diode or the like, the coarse mode tuning unit 212 controls the total capacitance of elements of the variable capacitor based on an analog signal, such as an analog control voltage, as the coarse mode tuning signal (CO_TUNE).

The fine mode tuning unit 213 performs fine mode tuning for the dual mode tuning digitally controlled crystal oscillator 200.

In substantially the same manner as the coarse mode tuning unit 212, the fine mode tuning unit 213 receives a fine mode tuning signal (FI_TUNE) composed of a digital control code or an analog control signal and controls the fine mode variable capacitor unit 215, which constitutes part of the oscillation circuit 211, in response to the received tuning signal (FI_TUNE). For example, the fine mode tuning unit 213 controls the oscillation circuit 211 in response to an AFC signal received from a modem chip.

The fine mode variable capacitor unit 215 controlled by the fine mode tuning unit 213, similar to the coarse mode variable capacitor unit 214 controlled by the coarse mode tuning unit 212, may have the capacitor bank or the variable capacitor element having the characteristics of the variable capacitor. According to the construction of the fine mode variable capacitor unit 215, the fine mode tuning signal (FI_TUNE) inputted to the fine mode tuning unit 213 from the external source may be a digital control code or an analog control signal, and a detailed explanation thereof will be omitted.

The coarse mode tuning unit 212 and the fine mode tuning unit 213 have respective tuning ranges and tuning resolutions. The tuning range of the coarse mode tuning unit 212 has a higher value in comparison with the tuning range of the fine mode tuning unit 213. Similarly, the tuning resolution of the coarse mode tuning unit 212 has a lower value in comparison with the tuning resolution of the fine mode tuning unit 213.

The tuning control unit 220 is a constituent element of the dual mode digitally controlled crystal oscillator 200 according to an exemplary embodiment of the present invention. The tuning control unit 220 controls the coarse mode tuning signal (CO_TUNE) for the coarse mode tuning unit 212, in response to the fine mode tuning signal (FI_TUNE) of the fine mode tuning unit 213.

The tuning control unit 220 receives the fine mode tuning signal (FI_TUNE), and outputs an internal coarse mode tuning signal (CO_TUNE_INT). The internal coarse mode tuning signal (CO_TUNE_INT) is generated by controlling the current coarse mode tuning signal (CO_TUNE) upon the fine mode tuning signal (FI_TUNE) reaching a boundary of the upper or the lower limit of the fine mode tuning signal (FI_TUNE).

A dual mode tuning process of the dual mode tuning digitally controlled crystal oscillator 200, implements controls of tuning range of the fine mode tuning by re-executing the coarse mode tuning in the process of the fine mode tuning.

The tuning control unit 220 may have various forms according to whether the fine mode tuning signal (FI_TUNE) has a type of digital control code or analog control signal. Hereinafter, exemplary embodiments of the tuning control unit 220 and operations thereof will be described.

Figure 3:
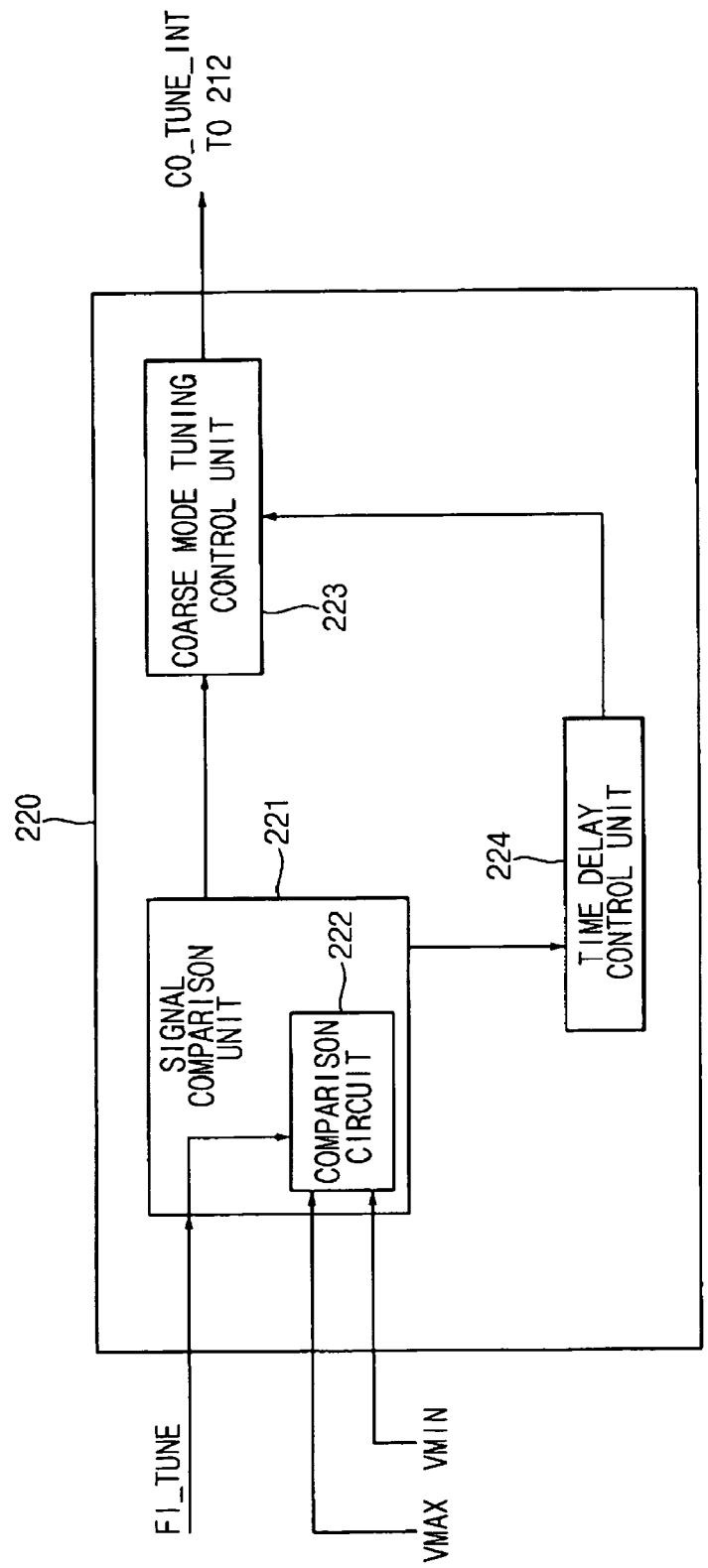
FIG. 3 is a block diagram illustrating a tuning control unit that may be applied to a dual mode tuning digitally controlled crystal oscillator according to an exemplary embodiment of the present invention.

FIG. 3 is a block diagram illustrating a tuning control unit 220 of the dual mode tuning digitally controlled crystal oscillator 200 according to an exemplary embodiment of the present invention.

With reference to FIG. 3, the tuning control unit 220 may include a signal comparison unit 221 for receiving the fine mode tuning signal (FI_TUNE) for the fine mode tuning from the external source and a coarse mode tuning control unit 223 for outputting the internal coarse mode tuning signal (CO_TUNE_INT) to the coarse mode tuning unit 212. The tuning control unit 220 in FIG. 3 shows a case in which the fine mode tuning signal (FI_TUNE) may be composed of an analog control signal such as a voltage signal and the like.

The signal comparison unit 221 determines whether the fine mode tuning signal (FI_TUNE) inputted from the external source, for example, an AFC signal inputted from the modem chip, reaches or approaches the upper or the lower limit of the fine mode tuning signal (FI_TUNE), wherein the fine mode tuning signal (FI_TUNE) is out of the tuning range of the fine mode tuning or not. The signal comparison unit 221 may include a comparison circuit 222. The comparison circuit 222 compares a voltage of the fine mode tuning signal (FI_TUNE) with voltages VMAX and VMIN respectively corresponding to the upper or the lower limit of the fine mode tuning signal (FI_TUNE).

The coarse mode tuning control unit 223 outputs the internal coarse mode tuning signal (CO_TUNE_INT) controlling the coarse mode tuning unit 212 in case that the signal comparison unit 221 determines that the fine mode tuning signal (FI_TUNE) inputted from the external source reaches the upper limit (VMAX) or the lower limit (VMIN) of the fine mode tuning signal (FI_TUNE).

For example, upon the signal comparison unit 221 determining that the fine mode tuning signal (FI_TUNE) reaches the upper limit (VMAX) of the fine mode tuning signal (FI_TUNE), the coarse mode tuning control unit 223 outputs the internal coarse mode tuning signal (CO_TUNE_INT) that is obtained by adjusting the coarse mode tuning signal (CO_TUNE) upward, e.g., 1 ppm on the course range. Upon the signal comparison unit 221 determining that the fine mode tuning signal (FI_TUNE) reaches the lower limit (VMIN) of the fine mode tuning unit 212, the coarse mode tuning control unit 223 outputs the internal coarse mode tuning signal (CO_TUNE_INT) that is obtained by adjusting the coarse mode tuning signal by downward, e.g., 1 ppm on the course range.

The tuning control unit 220 may further include a time delay control unit 224. The time delay control unit 224 produces a predetermined delay time needed for a fine mode tuning signal (FI_TUNE) inputted from an exterior, for example, the AFC signal fed back from the modem chip.

Figure 4:
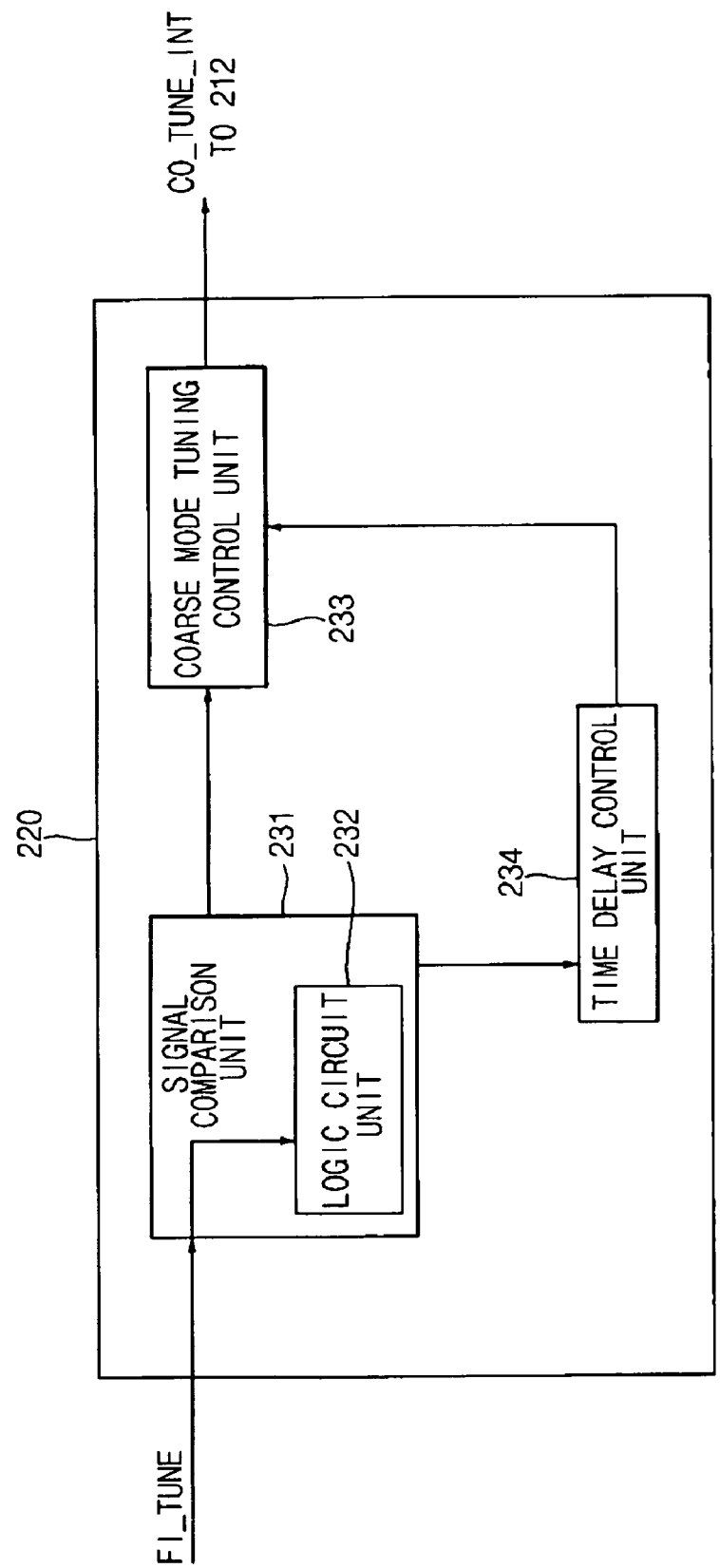
FIG. 4 is a block diagram illustrating a tuning control unit that may be applied to a dual mode tuning digitally controlled crystal oscillator according to another exemplary embodiment of the present invention.

FIG. 4 is a block diagram illustrating the tuning control unit 220 that may be applied to the dual mode tuning digitally controlled crystal oscillator 200 according to another exemplary embodiment of the present invention.

With reference to FIG. 4, the tuning control unit 220 may include a signal comparison unit 231 for receiving the fine mode signal (FI_TUNE) from the external source for fine mode tuning, and a coarse mode tuning control unit 233 for outputting the internal coarse mode tuning signal (CO_TUNE_INT) to the coarse mode tuning unit 212.

The tuning control unit 220 illustrated in FIG. 4 has substantially the same operation as that of the tuning control unit 220 illustrated in FIG. 3 except that the received fine mode tuning signal (FI_TUNE) is a digital control code.

The signal comparison unit 231 determines whether the fine mode tuning signal (FI_TUNE) composed of the digital control code inputted from the external source, e.g., the AFC signal inputted from the modem chip, reaches or approaches the upper or the lower limit of the fine mode tuning signal (FI_TUNE), wherein the fine mode tuning signal (FI_TUNE) is out of a tuning range of the fine mode tuning or not. The signal comparison unit 231 includes a logic circuit unit 232 for determining whether the fine mode tuning signal (FI_TUNE) reaches a maximum (MAX) or a minimum (MIN).

A coarse mode tuning control unit 233 outputs the internal coarse mode tuning signal (CO_TUNE_INT) controlling the coarse mode tuning unit 212 in case that the signal comparison unit 231 determining that the fine mode tuning signal (FI_TUNE) inputted from the external source reaches the upper or the lower limit of the fine mode tuning signal (FI_TUNE).

For example, upon the signal comparison unit 231 determining that the fine mode tuning signal (FI_TUNE) inputted from the external source reaches the upper limit (MAX) of the fine mode tuning signal (FI_TUNE), the coarse mode tuning control unit 233 outputs the internal coarse mode tuning signal (CO_TUNE_INT) that is obtained by adjusting the coarse mode tuning signal (CO_TUNE) upward, e.g., 1 ppm on the course range. Upon the signal comparison unit 231 determining that the fine mode tuning signal (FI_TUNE) inputted from an external source reaches the lowest limit (VMIN) of the fine mode tuning signal, the coarse mode tuning control unit 233 outputs the internal coarse mode tuning signal (CO_TUNE_INT) that is obtained by decreasing the coarse mode tuning signal downward, e.g., 1 ppm on the course range.

The tuning control unit 220 illustrated in FIG. 4, substantially similar to the tuning control unit 220 illustrated in FIG. 3, may also additionally include a time delay control unit 234.

Figure 1:
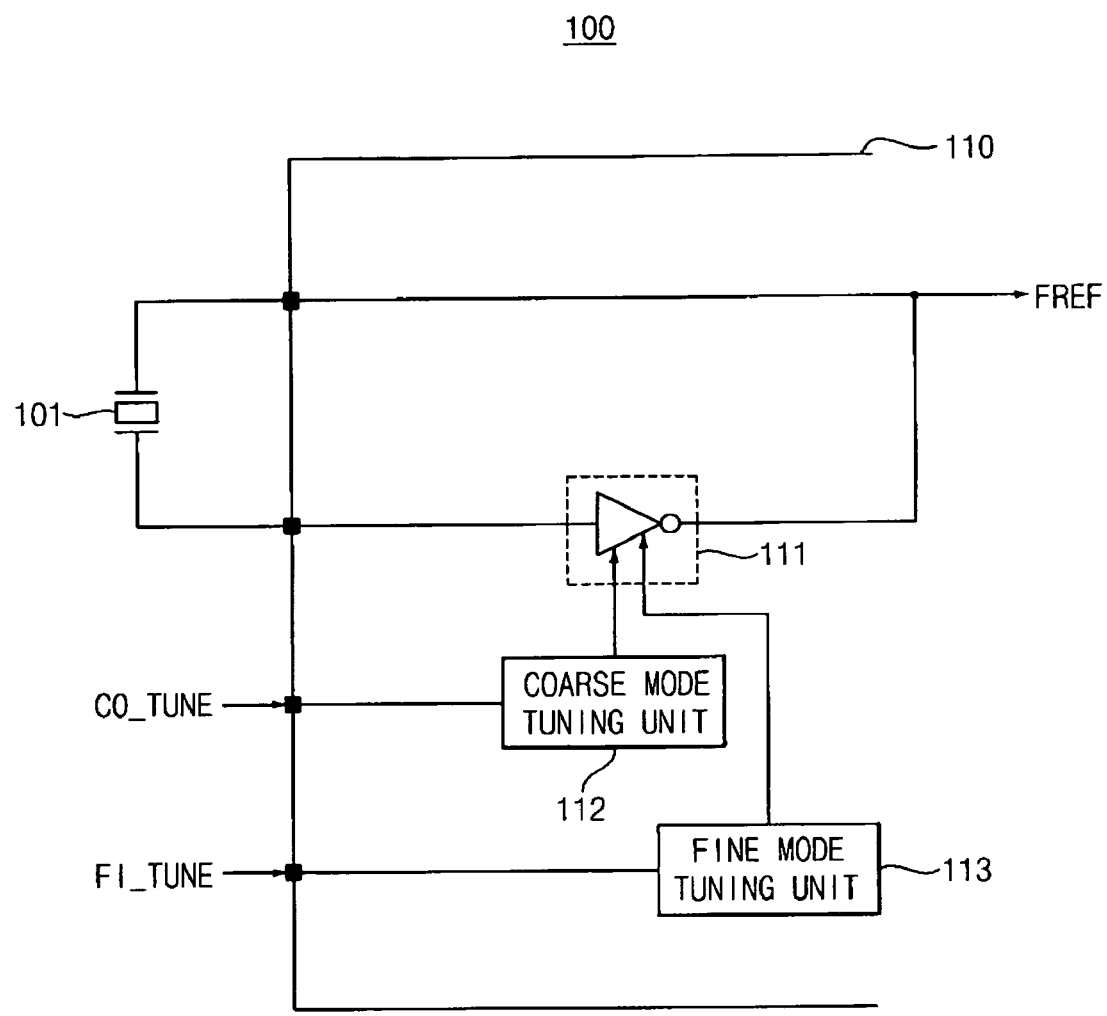
FIG. 1 is a block diagram illustrating a dual mode tuning digitally controlled crystal oscillator.
Figure 5A:
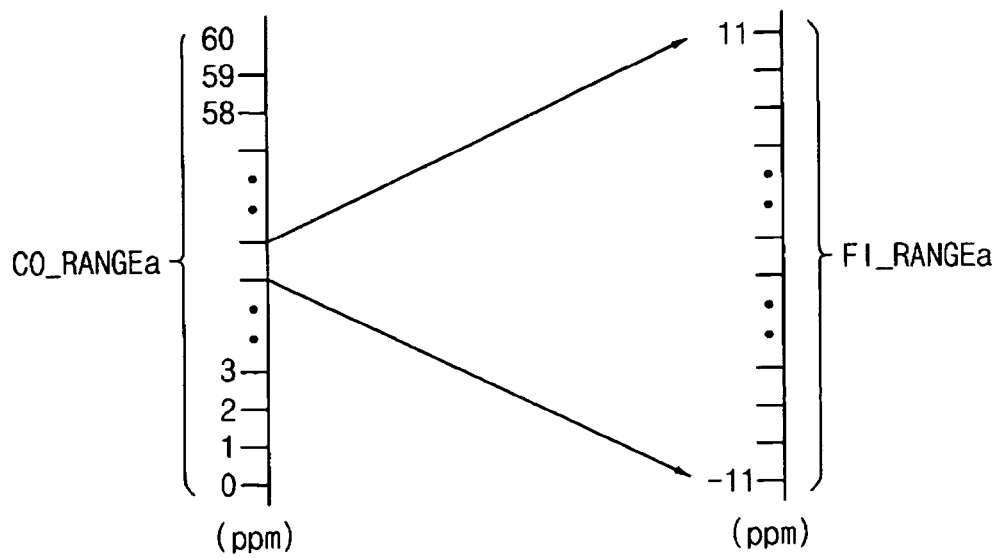
FIGS. 5A and 5B are respectively diagrams illustrating a tuning range of the conventional dual mode tuning digitally controlled crystal oscillator and a tuning range of the dual mode tuning digitally controlled crystal oscillator according to an exemplary embodiment of the present invention.
Figure 5B:
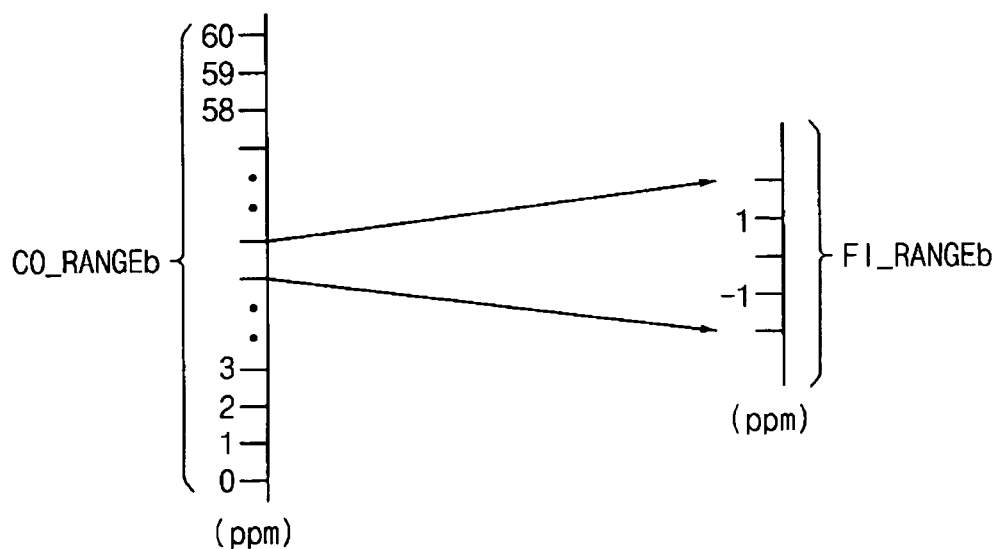

FIGS. 5A and 5B are diagrams illustrating a tuning range of the dual mode tuning digitally controlled crystal oscillator of FIG. 1 and a tuning range of the dual mode tuning digitally controlled crystal oscillator according to an exemplary embodiment of the present invention.

With reference to FIG. 5A, the dual mode tuning digitally controlled crystal oscillator of FIG. 1 has a coarse mode tuning range (CO_RANGEa) with an interval of 60 ppm, and a coarse mode tuning resolution of 1 ppm.

In the digitally controlled crystal oscillator of FIG. 1, the coarse mode tuning operation is performed within the coarse mode tuning range (CO_RANGEa) of 60 ppm in increments of 1 ppm, and the tuning range varies from +10 to −10 ppm due to aging or temperature variation of a crystal resonator, an interval of a fine mode tuning range (FI_RANGEa) needs to be over at least 22 ppm as shown in FIG. 5A.

With reference to FIG. 5B, a coarse mode tuning range (CO_RANGEb) of the dual mode tuning digitally controlled crystal oscillator according to an exemplary embodiment of the present invention has a coarse mode tuning range (CO_RANGEb) with the interval of 60 ppm and the coarse mode tuning resolution of 1 ppm.

The fine mode tuning range (FI_RANGEb) of the dual mode tuning digitally controlled crystal oscillator according to an exemplary embodiment of the present invention has a relatively narrower tuning range as compared to that of FIG. 5A. For example, the fine mode tuning range (FI_RANGEb) according to an exemplary embodiment of the present invention has a range of about 1 ppm (+/−).

Figure 6:
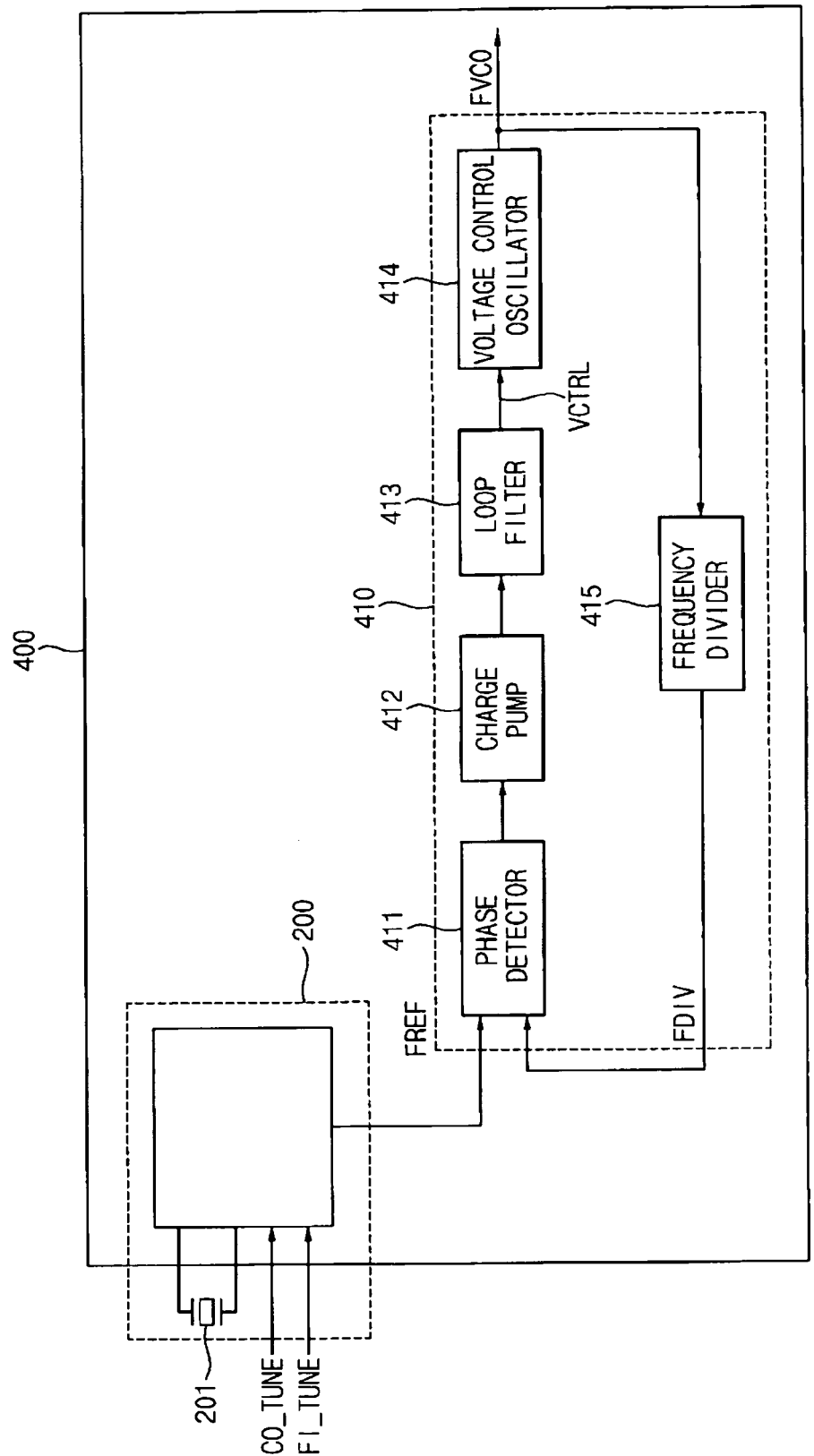
FIG. 6 is a block diagram illustrating a frequency synthesizer using a dual mode tuning digitally controlled crystal oscillator according to an exemplary embodiment of the present invention.

FIG. 6 is a block diagram illustrating a frequency synthesizer using the dual mode tuning digitally controlled crystal oscillator according to an example embodiment of the present invention.

With reference to FIG. 6, a frequency synthesizer 400 includes the dual mode tuning digitally controlled crystal oscillator 200 and a phase-locked loop 410.

The dual mode digitally controlled crystal oscillator 200 provides a substantially stable reference frequency (FREF) to the phase-locked loop 410.

The phase-locked loop 410 includes a phase detector 411, a charge pump 412, a loop filter 413, a voltage control oscillator 414 and a frequency divider 415. It will be apparent to one of ordinary skill in the art that various types of phase-locked loops may be used for the frequency synthesizer 400 together with the dual mode tuning digitally controlled crystal oscillator 200.

The reference frequency signal (FREF) is provided to the phase detector 411 of the phase-locked loop 410 from the dual mode digitally controlled crystal oscillator 200. A frequency signal (FDIV), generated by dividing an oscillation frequency (FVCO) of the voltage control oscillator 414 using a predetermined division ratio needed for the frequency divider 415, is provided to the phase detection unit 411.

A result of the comparison between the phases of two frequency signals (FREF, FDIV) at the phase detection unit 411 is outputted to the charge pump 412. The charge pump 412 and the loop filter 413 output a control voltage (VCTRL) for controlling the oscillation frequency (FVCO) of the voltage control oscillator 414, and the oscillation frequency (FVCO) of the voltage control oscillator 414 is generated.

While exemplary embodiments of the present invention described in detail, it should be understood that various changes, substitutions and alterations may be made herein without departing from the scope of the present invention.

What is claimed is:

1. A dual mode tuning digitally controlled crystal oscillator comprising:
   a crystal resonator that resonates at substantially a predetermined resonance frequency;
   an oscillation circuit, coupled to the crystal resonator, generating an oscillation frequency based on the predetermined resonance frequency to output the oscillation frequency;
   a coarse mode tuning unit performing a coarse mode tuning operation on the oscillation frequency by controlling the oscillation circuit in response to one of a coarse mode tuning signal and a controlled coarse mode tuning signal;
   a fine mode tuning unit performing a fine mode tuning operation on the oscillation frequency by controlling the oscillation circuit in response to a fine mode tuning signal; and
   a tuning control unit controlling the coarse mode tuning signal to output the controlled coarse mode tuning signal to the coarse mode tuning unit in response to the fine mode tuning signal, wherein the tuning control unit comprises:
   a signal comparison unit determining whether the fine mode tuning signal approaches an upper or a lower limit of the fine mode tuning signal; and
   a coarse mode tuning control unit controlling the coarse mode tuning signal based on a determination of the signal comparison unit to output the internal coarse mode signal to the coarse mode tuning unit.

2. The dual mode tuning digitally controlled crystal oscillator of claim 1, wherein the tuning control unit adjusts the coarse mode tuning signal downward to output an internal coarse mode tuning signal to the coarse mode tuning unit where the fine mode tuning signal approaches the lower limit of the fine mode tuning signal, and the coarse mode tuning control unit adjusts the current coarse mode tuning signal upward to output the internal coarse mode tuning signal to the coarse mode tuning unit where the fine mode tuning signal approaches the upper limit of the fine mode tuning signal.

3. The dual mode tuning digitally controlled crystal oscillator of claim 1, wherein the tuning control unit further includes a time delay control unit delaying an output of the internal coarse mode tuning signal by a predetermined time from a time point of the determination of the signal comparison unit.

4. The dual mode tuning digitally controlled crystal oscillator of claim 1, wherein the oscillation circuit includes a coarse mode variable capacitor unit controlling the oscillation frequency of the oscillation circuit under the control of the coarse mode tuning unit.

5. The dual mode tuning digitally controlled crystal oscillator of claim 4, wherein the coarse mode variable capacitor unit includes a capacitor bank having a plurality of capacitors and switching elements coupled in series and in parallel.

6. The dual mode tuning digitally controlled crystal oscillator of claim 5, wherein the coarse mode tuning signal includes a digital control code, and the coarse mode tuning unit changes a total capacitance of the capacitor bank in response to the coarse mode tuning signal.

7. The dual mode tuning digitally controlled crystal oscillator of claim 4, wherein the coarse mode variable capacitor unit includes at least one varactor diode.

8. The dual mode tuning digitally controlled crystal oscillator of claim 7, wherein the coarse mode tuning signal includes an analog control signal, and the coarse mode tuning unit changes a capacitance of the varactor diode in response to the coarse mode tuning signal.

9. The dual mode tuning digitally controlled crystal oscillator of claim 1, wherein the oscillation circuit includes a fine mode variable capacitor unit controlling the oscillation frequency of the oscillation circuit under the control of the fine mode tuning unit.

10. The dual mode tuning digitally controlled crystal oscillator of claim 9, wherein the fine mode variable capacitor unit includes a capacitor bank having a plurality of capacitors and switching elements coupled in series and in parallel.

11. The dual mode tuning digitally controlled crystal oscillator of claim 10, wherein the fine mode tuning signal includes a digital control code, and the fine mode tuning unit changes a total capacitance of the capacitor bank in response to the fine mode tuning signal.

12. The dual mode tuning digitally controlled crystal oscillator of claim 9, wherein the fine mode variable capacitor unit includes at least one varactor diode.

13. The dual mode tuning digitally controlled crystal oscillator of claim 12, wherein the fine mode tuning signal includes an analog control signal, and the fine mode tuning unit changes a capacitance of the varactor diode in response to the fine mode tuning signal.

14. The dual mode tuning digitally controlled crystal oscillator of claim 1, coupled to a phase-locked loop generating a desired channel frequency based on the oscillation frequency, wherein the dual mode tuning digitally controlled crystal oscillator and the phase-locked loop form a frequency synthesizer.

15. The dual mode tuning digitally controlled crystal oscillator of claim 1, wherein a frequency error of the crystal resonator is substantially compensated for.

16. A method of operating a dual mode tuning digitally controlled crystal oscillator, comprising:
- resonating a crystal resonator at substantially a predetermined resonance frequency;
- generating an oscillation frequency based on the resonance frequency by an oscillation circuit to output the oscillation frequency as a reference frequency;
- performing a coarse mode tuning operation on the oscillation frequency by controlling the oscillation circuit in response to a coarse mode tuning signal;
- performing a fine mode tuning operation on the oscillation frequency by controlling the oscillation circuit in response to a fine mode tuning signal;
- comparing the fine mode tuning signal to determine whether the fine mode tuning signal approaches an upper or a lower limit of the fine mode tuning signal; and
- changing the coarse mode tuning signal in response to the determination.

17. The method of claim 16, wherein the coarse mode tuning signal is adjusted downward where the fine mode tuning signal approaches a lower limit of the fine mode tuning signal, and the coarse mode tuning signal is adjusted upward where the fine mode tuning signal approaches an upper limit of the coarse mode tuning signal.

18. The method of claim 15, further comprising, compensating, substantially, for a frequency error of the crystal resonator.

19. The dual mode tuning digitally controlled crystal oscillator of claim 1, wherein the coarse mode tuning signal is determined through a calibration operation in a manufacturing process.

* * * * *